United States Patent
Kwak

(10) Patent No.: US 7,944,771 B2
(45) Date of Patent: May 17, 2011

(54) SEMICONDUCTOR INTEGRATED CIRCUIT AND METHOD OF PROCESSING ADDRESS AND COMMAND SIGNALS THEREOF

(75) Inventor: Seung-Wook Kwak, Ichon (KR)

(73) Assignee: Hynix Semiconductor Inc. (KR)

( * ) Notice: Subject to any disclaimer, the term of this patent is extended or adjusted under 35 U.S.C. 154(b) by 158 days.

(21) Appl. No.: 12/345,275

(22) Filed: Dec. 29, 2008

(65) Prior Publication Data

US 2009/0274002 A1    Nov. 5, 2009

(30) Foreign Application Priority Data

May 2, 2008    (KR) .................. 10-2008-0041280

(51) Int. Cl.
*G11C 8/00* (2006.01)

(52) U.S. Cl. ........... 365/233.1; 365/233.11; 365/233.12; 365/233.19

(58) Field of Classification Search ................ 365/233.1, 365/233.11, 233.01, 233.12, 233.19
See application file for complete search history.

(56) References Cited

U.S. PATENT DOCUMENTS

| | | | |
|---|---|---|---|
| 6,021,077 A | 2/2000 | Nakaoka | |
| 6,484,246 B2 * | 11/2002 | Tsuchida et al. | 711/169 |
| 6,751,157 B2 * | 6/2004 | Leung | 365/233.14 |
| 7,152,150 B2 * | 12/2006 | Sato et al. | 711/168 |
| 2009/0154278 A1 * | 6/2009 | Chan-Choi et al. | 365/222 |

FOREIGN PATENT DOCUMENTS

| | | |
|---|---|---|
| JP | 2001-195895 | 7/2001 |
| JP | 2003-077299 | 3/2003 |
| KR | 1020040095962 A | 11/2004 |
| KR | 1020060114737 A | 11/2006 |
| KR | 1020070040745 A | 4/2007 |
| KR | 100718038 B1 | 5/2007 |

* cited by examiner

*Primary Examiner* — Pho M Luu
(74) *Attorney, Agent, or Firm* — Baker & McKenzie LLP

(57) ABSTRACT

A semiconductor integrated circuit device includes an input unit configured to receive address and command signals, an internal address generator configured to output an internal address signal by adjusting a timing of the input address signal to correspond to a predetermined internal signal processing timing margin, and an internal command generator configured to output an internal command having a predetermined time difference from the internal address signal by adjusting a timing of the input command signal.

18 Claims, 3 Drawing Sheets

US 7,944,771 B2

SEMICONDUCTOR INTEGRATED CIRCUIT AND METHOD OF PROCESSING ADDRESS AND COMMAND SIGNALS THEREOF

The present application claims priority under 35 U.S.C. 119(a) to Korean Patent Application No. 10-2008-0041280, filed on May 2, 2008, in the Korean Intellectual Property Office, which is incorporated herein by reference in its entirety as if set forth in full.

BACKGROUND

1. Technical Field

The embodiments described herein relate to a semiconductor device and, more particularly, to a semiconductor integrated circuit (IC) device and a method of processing address and command signals thereof.

2. Related Art

In general, one common performance indicator of a semiconductor IC device, such as a graphic memory or a main memory, is power consumption or operational speed. In active operational mode and read/write operational mode, a semiconductor IC device simultaneously processes command and address signal during high-speed operations.

FIG. 1 is a waveform diagram demonstrating a conventional method of using address and command signals in a semiconductor IC device. In FIG. 1, a semiconductor IC device receives address and command signals in a memory controller, such as a Graphic Processing Unit (GPU), together at one time. Here, both the address and command signals received at one time are decoded, and an internal command and an internal address are processed by considering a predetermined timing delay time, such as write latency WL, a burst length BL, and the like.

For example, in a case where a command signal input from an exterior of the IC device is a write command, an internal write command signal 'icas_WT' and an internal address signal 'iADD' are created to be suitable for a rising edge of a clock pulse signal 'CLK', as shown in FIG. 1. In addition, a column selection signal 'Yi' is created by combining the internal write command signal 'icas_WT' and the internal address signal 'iADD'.

FIG. 2 is a waveform diagram demonstrating conventional address and command signal processing errors. However, in such a method, since the command signal and the address signal do not have sufficient margins, operation errors are created. That is, the delay of the internal address signal 'iADD' occurs due to variation in the Process/Voltage/Temperature (PVT) amounts, as shown in FIG. 2. Accordingly, since the internal write command signal 'icas_WT' is superimposed with a different internal address signal 'iADD', signal generation errors occur, i.e., an error of the column selection signal 'Yi', thereby resulting in operational errors of the semiconductor IC device.

SUMMARY

A semiconductor integrated circuit and a method of processing address and command signals thereof capable of preventing operational errors is described herein.

In one aspect, a semiconductor integrated circuit device includes an input unit configured to receive address and command signals, an internal address generator configured to output an internal address signal by adjusting a timing of the input address signal to correspond to a predetermined internal signal processing timing margin, and an internal command generator configured to output an internal command having a predetermined time difference from the internal address signal by adjusting a timing of the input command signal.

In another aspect, a method of processing address and command signals of a semiconductor integrated circuit device includes receiving external address signals and external command signals, producing an internal address signal by adjusting a timing of the external address signals to correspond to a predetermined internal signal processing timing margin, and producing an internal command signal having a predetermined time difference from the internal address signal by adjusting the timing of the external command signals.

These and other features, aspects, and embodiments are described below in the section "Detailed Description."

BRIEF DESCRIPTION OF THE DRAWINGS

Features, aspects, and embodiments are described in conjunctions with the attached drawings, in which.

DETAILED DESCRIPTION

Figure 3:
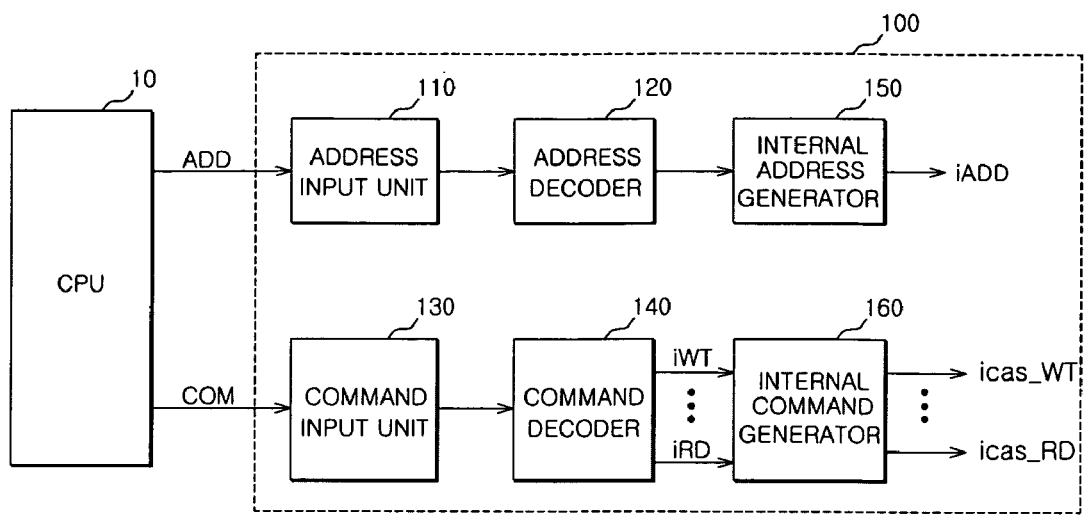
FIG. 3 is a schematic block diagram of an exemplary semiconductor IC device according to one embodiment.

FIG. 3 is a schematic block diagram of an exemplary semiconductor IC device according to one embodiment. In FIG. 3, a semiconductor IC device 100 can be configured to include an address input unit 110, an address decoder 120, a command input unit 130, a command decoder 140, an internal address generator 150, and an internal command generator 160.

The address input unit 110 and the command input unit 130 can be configured to receive an external address signal 'ADD' and an external command signal 'COM' simultaneously output from an external system, such as a GPU 10. Here, the address input unit 110 and the command input unit 130 each may have a buffer and a latch.

The address decoder 120 can be configured to decode and output an output signal of the address input unit 110.

The command decoder 140 can be configured to output decoding signals, such as 'iWT' and 'iRD', by decoding an output signal of the command input unit 130.

The internal address generator 150 can be configured to output an internal address signal 'iADD' to adjust the timing of the output signal of the address decoder 120 by applying an internal signal processing timing margin of the semiconductor IC device. The internal signal processing timing margin of the semiconductor IC device may include a write latency signal 'WL' and a burst length signal 'BL'.

The internal command generator 160 can be configured to output internal command signals to adjust the timing of the command decoding signals, such as 'iWT' and 'iRD', by applying the internal signal processing timing margin. The internal command generator 160 can output an internal write command signal 'icas_WT' and an internal read command signal 'icas_RD' by applying an additional timing margin so as to give a predetermined time difference between the internal write command signal 'icas_WT' and the internal read command signal 'icas_RD', and the internal address signal 'iADD' unlike the internal signal processing timing margin.

Figure 4:
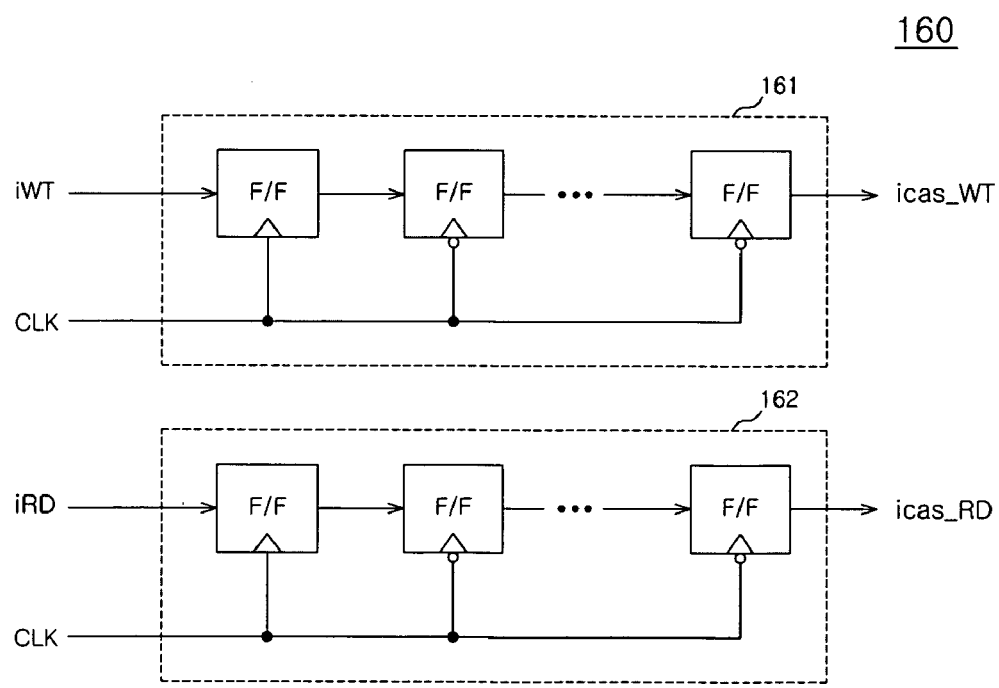
FIG. 4 is a schematic block diagram of an exemplary internal command generator that can be included in the device of FIG. 3 according to one embodiment.

FIG. 4 is a schematic block diagram of an exemplary internal command generator of FIG. 3 according to one embodiment. In FIG. 4, the internal command generator 160 can include a first timing controller 161 and a second timing controller 162.

The first timing controller 161, which can be configured to adjust the timing of the command decoding signals 'iWT', can include a plurality of flip-flops F/F connected to each other in series. The plurality of flip-flops F/F can be configured to sequentially receive and output the command decoding signals 'iWT'. For example, an output signal of the flip-flop F/F synchronized with a falling edge of a clock pulse signal 'CLK' can be output as the internal write command signal 'icas_WT' so that the internal write command signal 'icas_WT' can be generated later than the internal address signal 'iADD' by a time interval (tCK/2) corresponding to one-half of a clock time interval (tCK).

The second timing controller 162, which can be configured to adjust the timing of the command decoding signal 'iRD', can include the plurality of flip-flops F/F connected to each other in series. The plurality of flip-flops F/F can be configured to sequentially receive and output the command decoding signals 'iRD'. For example, the output signals of the flip-flop F/F synchronized with the falling edge of the clock pulse signal 'CLK' can be output as the internal read command signal 'icas_RD' so that the internal read command signal 'icas_RD' can be generated later than the internal address signal 'iADD' by the time interval (tCK/2) corresponding to one-half of the clock time interval (tCK).

The internal address generator 150 may be configured in the same manner as FIG. 4. However, the internal address generator 150 can be configured to produce an output signal of a flip-flop F/F synchronized with a rising edge of the clock pulse signal 'CLK' as the internal address signal 'iADD'.

The internal write command signal 'icas_WT' and the internal read command signal 'icas_RD' can be configured to be generated later than the internal address signal 'iADD'. However, the number of flip-flops F/F can be adjusted or a flip-flop F/F to output the internal write command signal 'icas_WT' and the internal read command signal 'icas_RD' can be selected from the plurality of flip-flops F/F in each of the first timing controller 161 and the second timing controller 162. Accordingly, the internal address signal 'iADD' can be generated later than the internal write command signal 'icas_WT' and the internal read command signal 'icas_RD'.

An exemplary method of processing address and command signals of a semiconductor IC device will now be described with regard to FIGS. 3 and 5.

Figure 5:
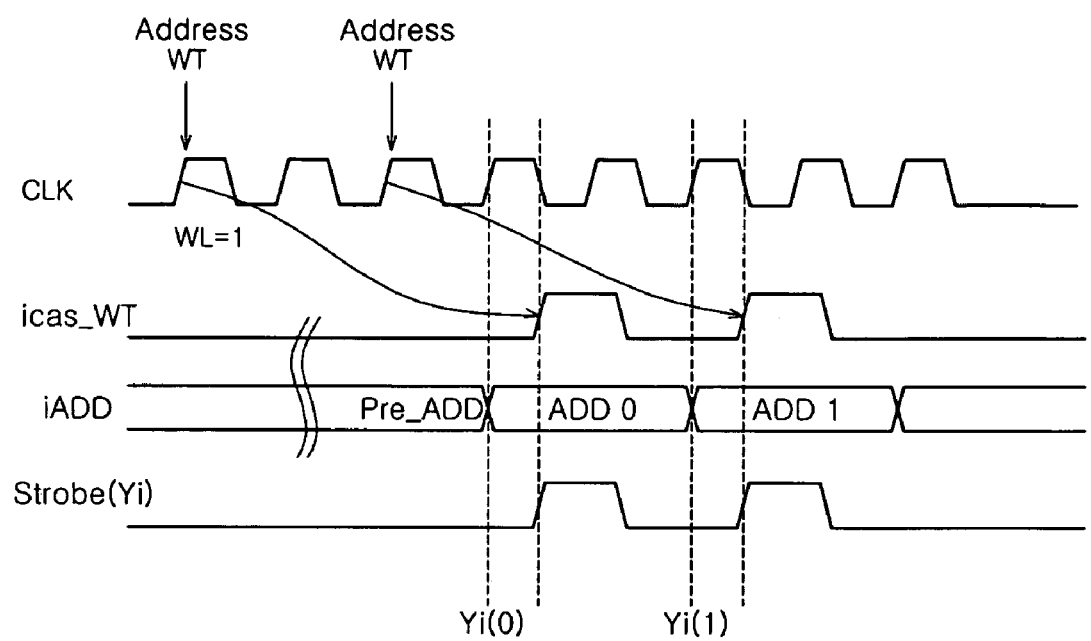
FIG. 5 is a waveform diagram demonstrating an exemplary method of processing address and command signals of a semiconductor IC device according to one embodiment.

FIG. 5 is a waveform diagram demonstrating an exemplary method of processing address and command signals of a semiconductor IC device according to one embodiment. In FIGS. 3 and 5, an external command signal 'ADD' and an external command signal 'COM' can be simultaneously output from a GPU 10. An address input unit 110 and a command input unit 130 of a semiconductor IC device 100 can receive and output the external address signal 'ADD' and the external command signal 'COM', respectively.

In FIG. 3, an address decoder 120 can decode and output an output signal of the address input unit 110. A command decoder 140 can output command decoding signals, such as 'iWT' and 'iRD', by decoding an output signal of the command input unit 130.

An internal address generator 150 can output an internal address signal 'iADD' synchronized with a rising edge of a clock pulse signal 'CLK' by adjusting the timing of an output signal of the address decoder 120 so as to correspond to an internal signal processing timing margin of the semiconductor IC device 100.

An internal command generator 160 can output an internal write command signal 'icas_WT' or an internal read command signal 'icas_RD' delayed later than the internal address signal 'iADD' by a predetermined time interval (tCK/2) by synchronizing the internal write command signal 'icas_WT' or the internal read command signal 'icas_RD' with a falling edge of the clock pulse signal 'CLK'.

As shown in FIG. 5, left and right sides of the internal write command signal 'icas_WT' can have sufficient margins in comparison with the internal address signal 'iADD'. Accordingly, the internal read command signal 'icas_RD' can also have sufficient margin at left and right sides thereof similar to the internal write command signal 'icas_WT'.

Figure 1:
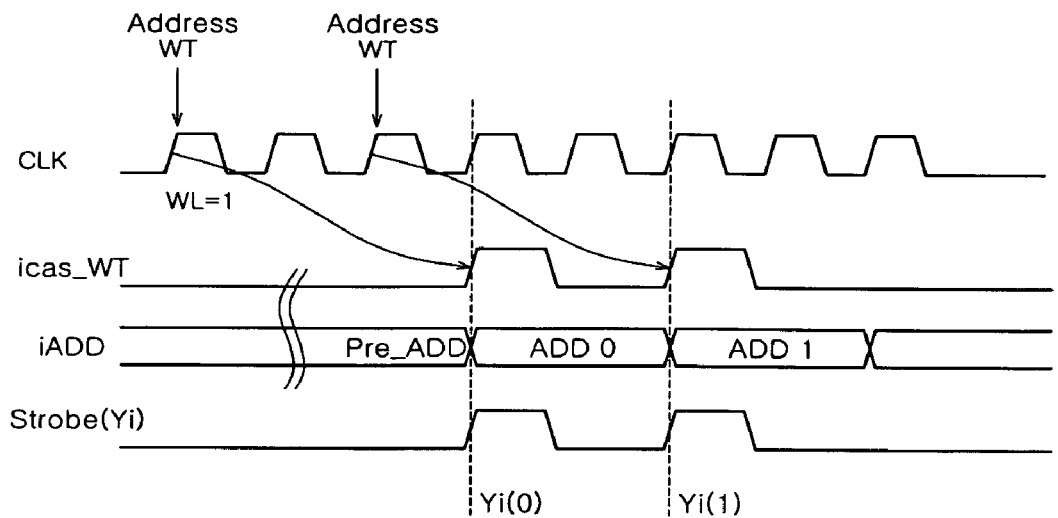
FIG. 1 is a waveform diagram demonstrating a conventional method of using address and command signals in a semiconductor IC device.
Figure 2:
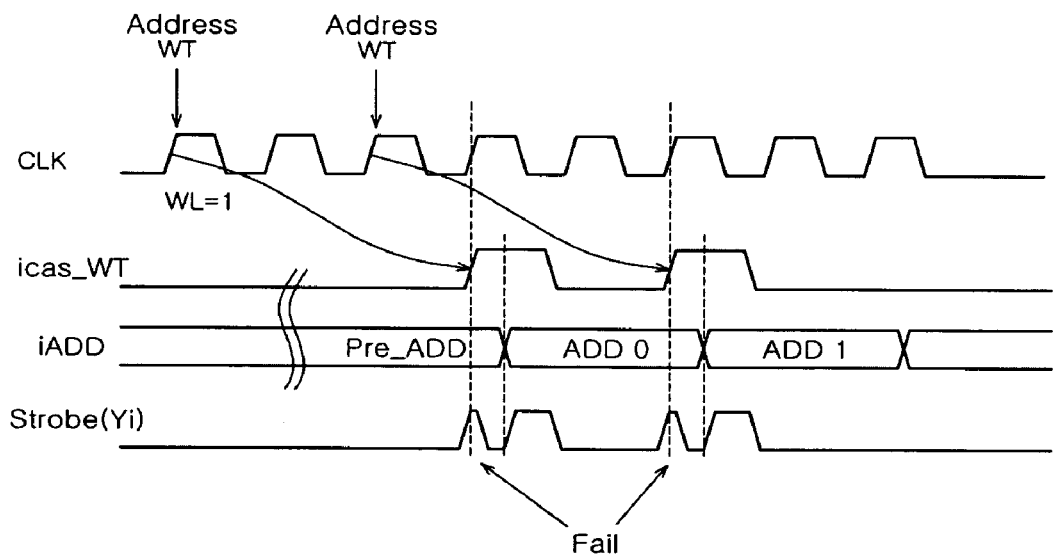
FIG. 2 is a waveform diagram demonstrating conventional address and command signal processing errors.

Since the internal command signals have enough margin widths, it is possible to prevent operation errors, such as generation errors of a column selection signal 'Yi', even though the internal address signal 'iADD' is delayed, as shown in FIG. 2.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor integrated circuit device, comprising:
an input unit configured to receive address and command signals;
an internal address generator configured to output an internal address signal by adjusting a timing of the input address signal to correspond to a predetermined internal signal processing timing margin; and
an internal command generator configured to output an internal command having a predetermined time difference from the internal address signal by adjusting a timing of the input command signal.

2. The semiconductor integrated circuit device of claim 1, wherein the internal address generator is configured to output the internal address signal by adjusting the timing of the address signal so as to correspond to timing margins corresponding to write latency signal WL and a burst length signal BL during a write operation of the semiconductor integrated circuit device.

3. The semiconductor integrated circuit device of claim 1, wherein the internal address generator is configured to output the internal address signal synchronized with a first edge of a clock pulse signal.

4. The semiconductor integrated circuit device of claim 3, wherein the internal command generator is configured to output the internal command signal synchronized with a second edge of the clock pulse signal.

5. The semiconductor integrated circuit device of claim 1, wherein the internal address generator is configured to output the internal address signal synchronized with a rising edge of a clock pulse signal.

6. The semiconductor integrated circuit of claim 5, wherein the internal command generator is configured to output the internal command signal synchronized with a falling edge of the clock pulse signal.

7. The semiconductor integrated circuit device of claim 1, wherein the internal command generator is configured to separately adjust the timings of a write command signal and a read command signal among the command signals.

8. The semiconductor integrated circuit device of claim 1, wherein the predetermined time difference is one-half of cycle time interval of the clock pulse signal.

9. The semiconductor integrated circuit device of claim 1, wherein the internal command generator includes a first timing controller and a second timing controller.

10. The semiconductor integrated circuit device of claim 9, wherein the first timing controller includes a plurality of flip-flops connected in series to output internal write command signals at a time later than the internal address signal by a time interval corresponding to one-half of a time interval of a clock pulse signal.

11. The semiconductor integrated circuit device of claim 9, wherein the second timing controller includes a plurality of flip-flops connected in series to output internal read command signals at a time later than the internal address signal by a time interval corresponding to one-half of a time interval of a clock pulse signal.

12. A method of processing address and command signals of a semiconductor integrated circuit device, comprising:
receiving external address signals and external command signals;
producing an internal address signal by adjusting a timing of the external address signals to correspond to a predetermined internal signal processing timing margin; and
producing an internal command signal having a predetermined time difference from the internal address signal by adjusting the timing of the external command signals.

13. The method of claim 12, wherein the predetermined internal signal processing timing margin is determined by write latency signal WL and a burst length signal BL during a write operation of the semiconductor integrated circuit device.

14. The method of claim 12, wherein the internal address signal is synchronized with a first edge of a clock pulse signal.

15. The method of claim 14, wherein the internal command signal is synchronized with a second edge of the clock pulse signal.

16. The method of claim 12, wherein the internal address signal is synchronized with a rising edge of a clock pulse signal.

17. The method of claim 16, wherein the internal command signal is synchronized with a falling edge of the clock pulse signal.

18. The method of claim 12, wherein a timing of the external command signal is separately adjusted with respect to a write command and a read command among the external command signals.

* * * * *